US007804696B2

(12) United States Patent
Kim

(10) Patent No.: US 7,804,696 B2
(45) Date of Patent: Sep. 28, 2010

(54) ELECTROMAGNETIC RADIATION CONTAINMENT IN AN ELECTRONIC MODULE

(75) Inventor: Daehwan Daniel Kim, Sunnyvale, CA (US)

(73) Assignee: Finisar Corporation, Sunnyvale, CA (US)

( * ) Notice: Subject to any disclaimer, the term of this patent is extended or adjusted under 35 U.S.C. 154(b) by 81 days.

(21) Appl. No.: 11/952,991

(22) Filed: Dec. 7, 2007

(65) Prior Publication Data

US 2008/0137306 A1    Jun. 12, 2008

Related U.S. Application Data

(60) Provisional application No. 60/869,111, filed on Dec. 7, 2006.

(51) Int. Cl.
 *H05K 9/00* (2006.01)
(52) U.S. Cl. ........................................ 361/818; 361/816
(58) Field of Classification Search ......... 361/800–802, 361/816, 818, 715
See application file for complete search history.

(56) References Cited

U.S. PATENT DOCUMENTS

| | | | | |
|---|---|---|---|---|
| 5,879,173 | A * | 3/1999 | Poplawski et al. | 439/138 |
| 6,474,876 | B1 * | 11/2002 | Sikorski, Jr. | 385/55 |
| 6,720,690 | B2 * | 4/2004 | Satoh et al. | 310/81 |
| 6,811,413 | B2 * | 11/2004 | Keeble et al. | 439/79 |
| 6,893,293 | B2 * | 5/2005 | Ice et al. | 439/607.2 |
| 6,986,679 | B1 * | 1/2006 | Aronson et al. | 439/374 |
| 7,195,403 | B2 * | 3/2007 | Oki et al. | 385/92 |
| 7,377,702 | B2 * | 5/2008 | Jablonski et al. | 385/92 |

FOREIGN PATENT DOCUMENTS

| | | |
|---|---|---|
| JP | 2000-323848 | 11/2000 |
| JP | 2000-331755 | 11/2000 |
| JP | 2001-015218 | 1/2001 |
| JP | 2001-185307 | 7/2001 |
| JP | 2002-252058 | 9/2002 |
| JP | 2003-031323 | 1/2003 |

* cited by examiner

*Primary Examiner*—Hung S Bui
(74) *Attorney, Agent, or Firm*—Workman Nydegger

(57) ABSTRACT

Electromagnetic radiation containment in an electronic module. In one example, an electronic module includes a housing, a printed circuit board, and an electrically conductive sealing element. The printed circuit board is partially positioned within the housing and defines an edge connector extending from the housing. The electrically conductive sealing element radially surrounds 360 degrees of one end of the housing and the printed circuit board proximate the edge connector such that when the edge connector is fully received in a host board connector mounted to a host board, the electrically conductive sealing element cooperates with a corresponding structure of the host board to at least partially define a Faraday cage substantially enclosing the edge connector and the host board connector. The housing defines a radial groove which aids in the retention of the sealing element.

19 Claims, 7 Drawing Sheets

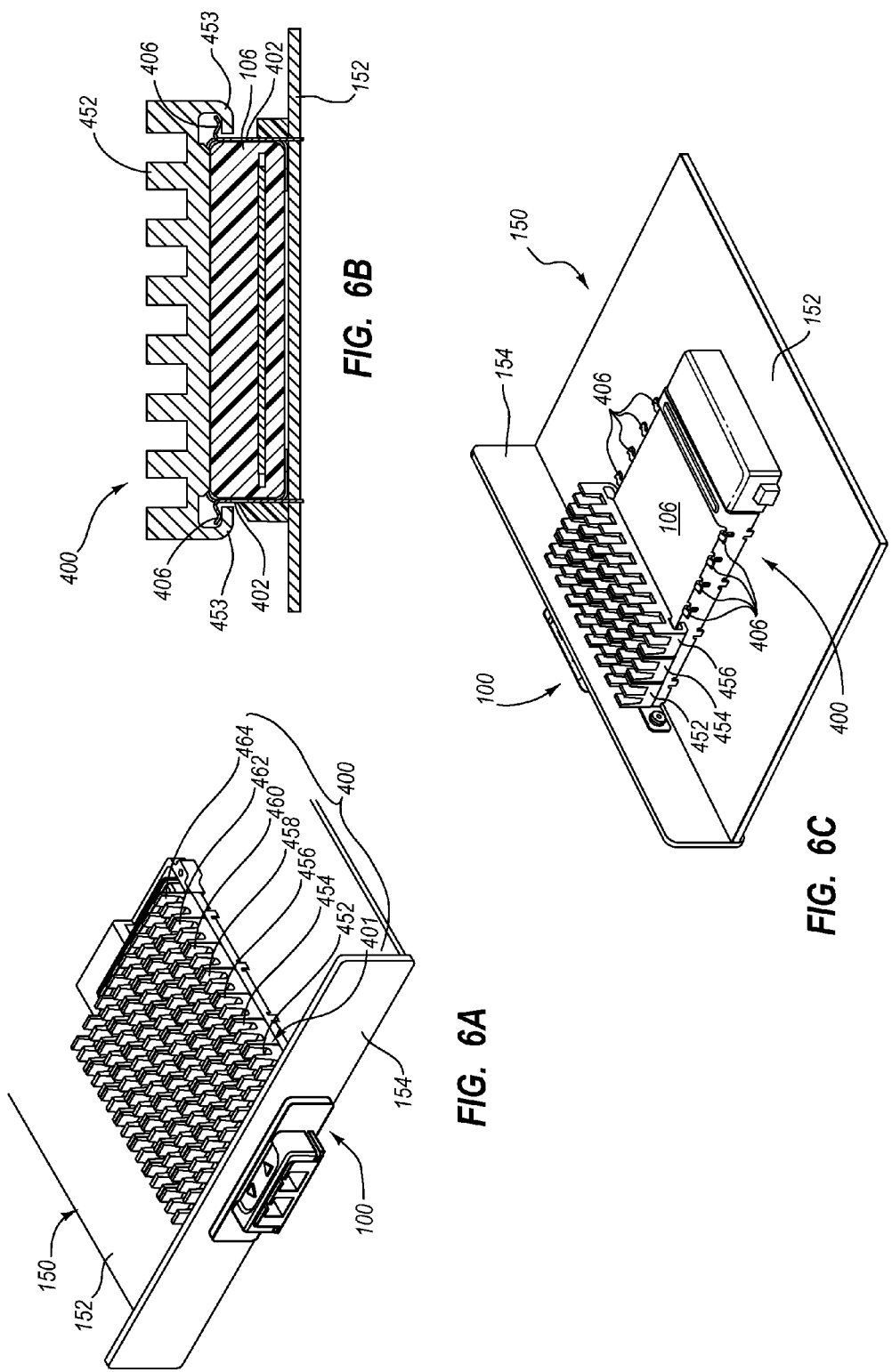

ELECTROMAGNETIC RADIATION CONTAINMENT IN AN ELECTRONIC MODULE

CROSS-REFERENCE TO RELATED APPLICATIONS

The present application claims priority from U.S. Provisional Patent Application Ser. No. 60/869,111, filed Dec. 7, 2006 and entitled "EMI CONTAINMENT AND HEAT DISSIPATION IN AN ELECTRONIC MODULE," which is incorporated herein by reference in its entirety.

BACKGROUND

Electronic modules, such as electronic or optoelectronic transceiver or transponder modules, are increasingly used in electronic and optoelectronic communication. Some modules can be plugged into a variety of host networking equipment. Multi-Source Agreements ("MSAs"), such as the X2 MSA and 10 Gb/s Small Form Factor Pluggable ("XFP") MSA specify, among other things, package dimensions for modules. Conformity with an MSA allows a module to be plugged into host equipment designed in compliance with the MSA. Modules typically communicate with a printed circuit board of a host device by transmitting electrical signals to the printed circuit board and receiving electrical signals from the printed circuit board. These electrical signals can then be transmitted by the module outside the host device as optical and/or electrical signals.

One common difficulty associated with modules is the generation of electromagnetic radiation that can result in electromagnetic interference ("EMI") in surrounding devices. The generation of electromagnetic radiation by a module is a matter of significant concern because any resulting EMI can seriously impair, if not prevent, the proper operation of other systems and devices in the vicinity. Thus, the containment of electromagnetic radiation is an important consideration in the design and use of electronic and optoelectronic transceiver and transponder modules.

There are a number of parameters that bear on the generation of electromagnetic radiation and the containment of electromagnetic radiation in modules. For example, the generation of electromagnetic radiation is a function, at least in part, of the data rate of the module. Thus, for example, the level of electromagnetic radiation associated with the operation of a 2 Gb/s module may not be of particular concern, while the level of electromagnetic radiation associated with the operation of a 10 Gb/s module can present significant problems in some cases. As data rates increase, the reliable containment of electromagnetic radiation has become increasingly important.

In recognition of the problems presented by electromagnetic radiation, various attempts have been made to contain electromagnetic radiation. Many of such attempts have focused on the development of various types of structures intended to contain, to the extent practicable, the electromagnetic radiation that causes EMI. However, the problems and deficiencies inherent in such attempts have become increasingly evident as data rates and corresponding operational frequencies increase. Thus, the problems associated with typical electromagnetic radiation containment structures appear likely to get worse with the passage of time unless adequate solutions are developed and implemented.

Another challenge inherent in modules concerns the generation of heat during the operation of the modules. This heat, if not dissipated, can cause a module to malfunction or to become damaged. A heat sink that is external to and separate from a module is sometimes used in connection with the module to help dissipate the heat generated by the module. However, such arrangements are only effective where there is substantial contact between the heat sink and one or more surfaces of the module. Such contact may not be readily attained where discontinuities and other imperfections exist in the heat sink and/or the module surfaces.

SUMMARY OF SOME EXAMPLE EMBODIMENTS

In general, example embodiments relate to electromagnetic radiation containment in an electronic module. The example electromagnetic radiation containment systems disclosed herein can contribute to desired performance of an electronic module.

In one example, an electromagnetic radiation containment system includes an electronic module having a protruding edge connector, a host board having a host board connector mounted thereto, and an electrically conductive shroud mounted to a ground plane of the host board. The electrically conductive shroud defines a first opening by way of which the edge connector of the electronic module can be received and that is sealed by the host board. The electrically conductive shroud further defines a second opening through which the host board connector is received. The electrically conductive shroud is also devoid of other openings that are large enough for electromagnetic radiation to escape therethrough. The electrically conductive shroud is sized and shaped to substantially enclose the host board connector mounted to the host board. The electromagnetic radiation containment system further includes, in this example, an electrically conductive sealing element disposed about a portion of the electronic module such that when the edge connector of the electronic module is fully received in the host board connector, the electrically conductive sealing element cooperates with the electronic module to seal the second opening of the electrically conductive shroud. The sealed electrically conductive shroud defines a Faraday cage substantially enclosing the edge connector and the host board connector.

In another example, an electronic module includes a housing, a printed circuit board, and an electrically conductive sealing element. The printed circuit board is partially positioned within the housing and defines an edge connector extending from the housing. The electrically conductive sealing element radially surrounds 360 degrees of one end of the housing and the printed circuit board proximate the edge connector such that when the edge connector is fully received in a host board connector mounted to a host board, the electrically conductive sealing element cooperates with a corresponding structure of the host board to at least partially define a Faraday cage substantially enclosing the edge connector and the host board connector. The housing also defines a radial groove which aids in the retention of the sealing element.

In yet another example, a host board includes a printed circuit board, a ground plane attached to the printed circuit board, a host board connector attached to the ground plane, and an electrically conductive shroud mounted to the ground plane and substantially enclosing the host board connector. The electrically conductive shroud defines an opening by way of which an edge connector of an electronic module can be received. The electrically conductive shroud is devoid of other unsealed openings that are large enough for electromagnetic radiation to escape therethrough. The electrically conductive shroud is sized and shaped to cooperate with a corresponding structure of the electronic module to at least partially define a Faraday cage substantially enclosing the edge connector and the host board connector.

BRIEF DESCRIPTION OF THE DRAWINGS

To further clarify aspects of the example embodiments, a more particular description of these example embodiments will be rendered by reference to the appended drawings. It is appreciated that these drawings depict only example embodiments of the invention and are therefore not to be considered limiting of its scope. The example embodiments will be described and explained with additional specificity and detail through the use of the accompanying drawings in which:

FIG. 6A is a front top perspective view of portions of the example heat management system of FIG. 5;

FIG. 6B is a partial rear view of portions of the example heat management system of FIG. 5; and FIG. 6C is a rear top perspective view of portions of the example heat management system of FIG. 5.

DETAILED DESCRIPTION OF SOME EXAMPLE EMBODIMENTS

Example embodiments relate to electromagnetic radiation containment and heat management in an electronic module. The example electromagnetic radiation containment systems and heat management systems disclosed herein can contribute to desired performance of an electronic module.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

I. Example Electronic Module

Figure 1B:
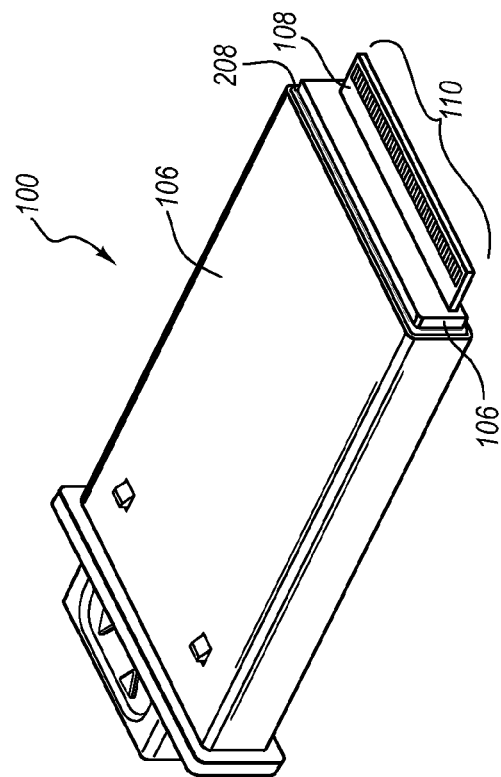
FIG. 1B is a rear bottom perspective view of the example electronic module of FIG. 1A.
Figure 1A:
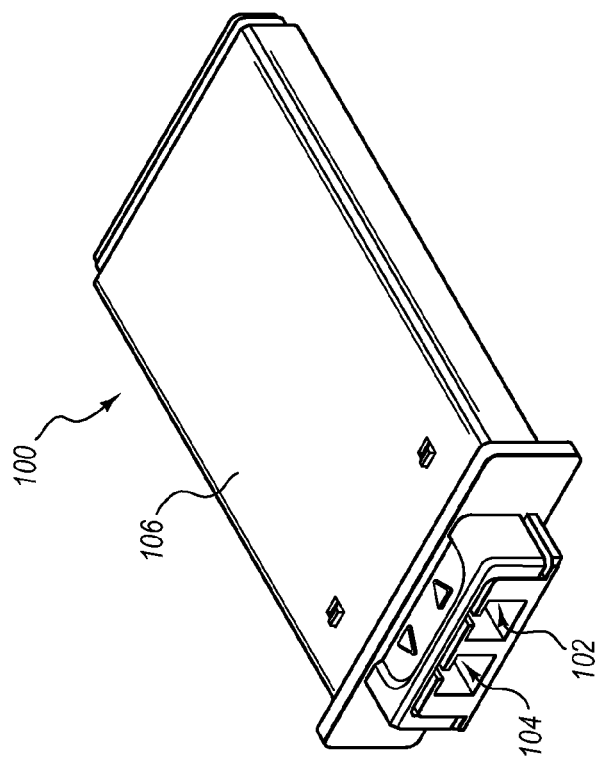
FIG. 1A is a front top perspective view of an example electronic module.

Reference is first made to FIGS. 1A and 1B which disclose aspects of an example electronic module 100. In general, the module 100 can be any type of transponder or transceiver module, including a transponder module that substantially complies with the X2 MSA. The example module 100 includes an optical input port 102 and an optical output port 104 through which optical signals can be received or transmitted, respectively. The example module 100 also includes a housing 106 within which a printed circuit board 108 is partially positioned. The printed circuit board 108 defines an edge connector 110, extending from the housing 106, by way of which electrical signals can be transmitted and received.

Figure 1C:
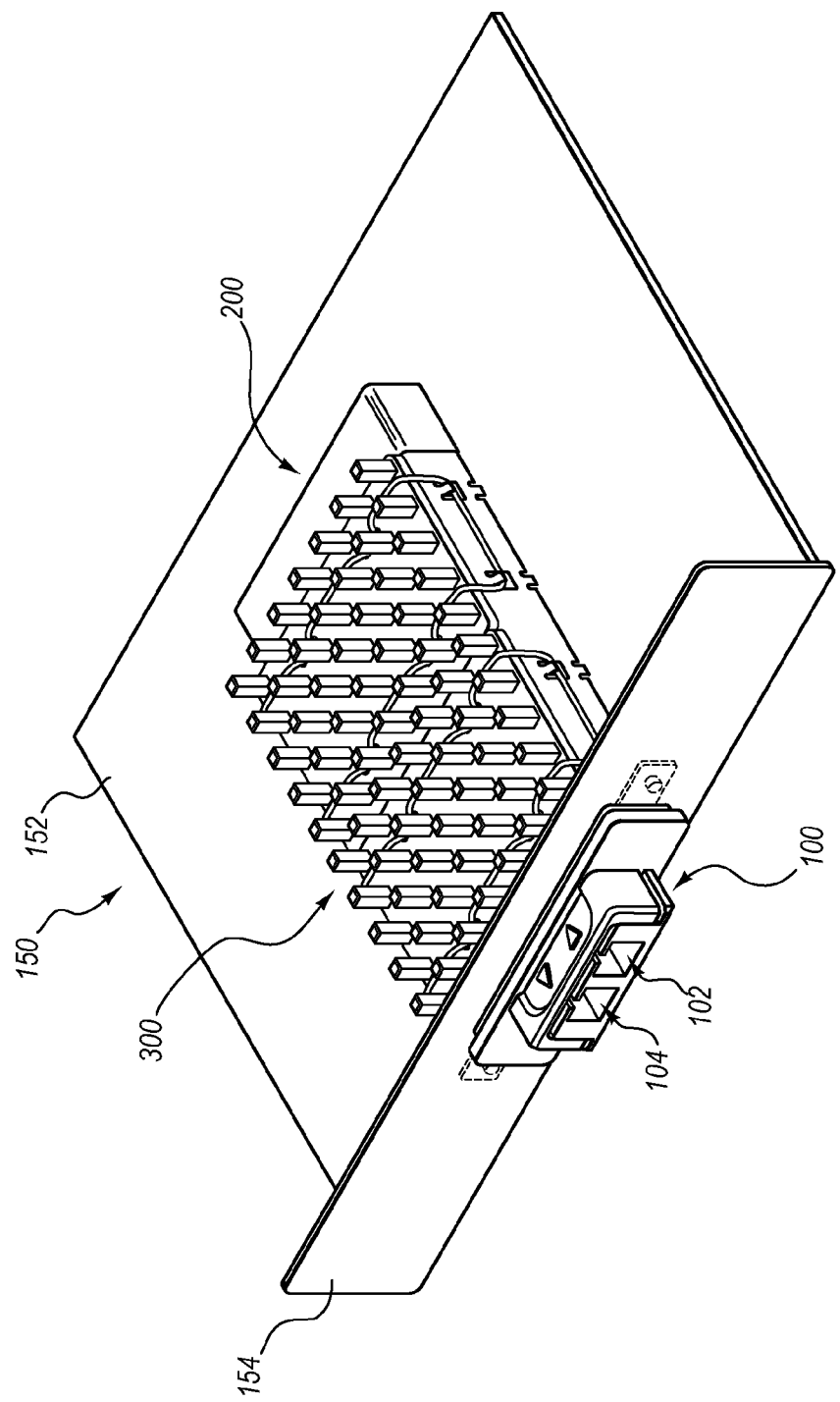
FIG. 1C is a front top perspective view of the electronic module of FIGS. 1A and 1B, as well as an example module guide, an example heat management system, and an example electromagnetic radiation containment system.

Turning now to FIG. 1C, the example module 100 is disclosed in connection with one example operating environment. In the example of FIG. 1C, the operating environment includes a host device 150 with a host board 152 and a face plate 154, an example electromagnetic radiation containment system 200, and an example heat management system 300. The module 100 is, in this example, a pluggable module that can be selectively engaged with, and disengaged from, the host device 150. In other embodiments, the module may be permanently fixed, for example, to the host board 152. When electrically connected with the host device 150, the module 100 can convert optical signals received at the optical input port 102 into electrical signals that are transmitted through the edge connector 110 (FIG. 1B) to the host board 152 of the host device 150 into which the module 100 is inserted. Similarly, electrical signals transmitted by the host board 152 can be received through the edge connector 110 (FIG. 1B) of the module 100 and then converted by the module 100 into optical signals for transmission through the optical output port 104.

It should be noted that the module 100 can be employed in connection with any suitable operating environment and is not constrained for use with the disclosed example environments. For example, embodiments of the module 100 can be employed in connection with any other operating environment that includes structures, systems and/or devices for physically and/or electrically interfacing with the module 100.

II. Example Electromagnetic Radiation Containment System

Figure 2B:
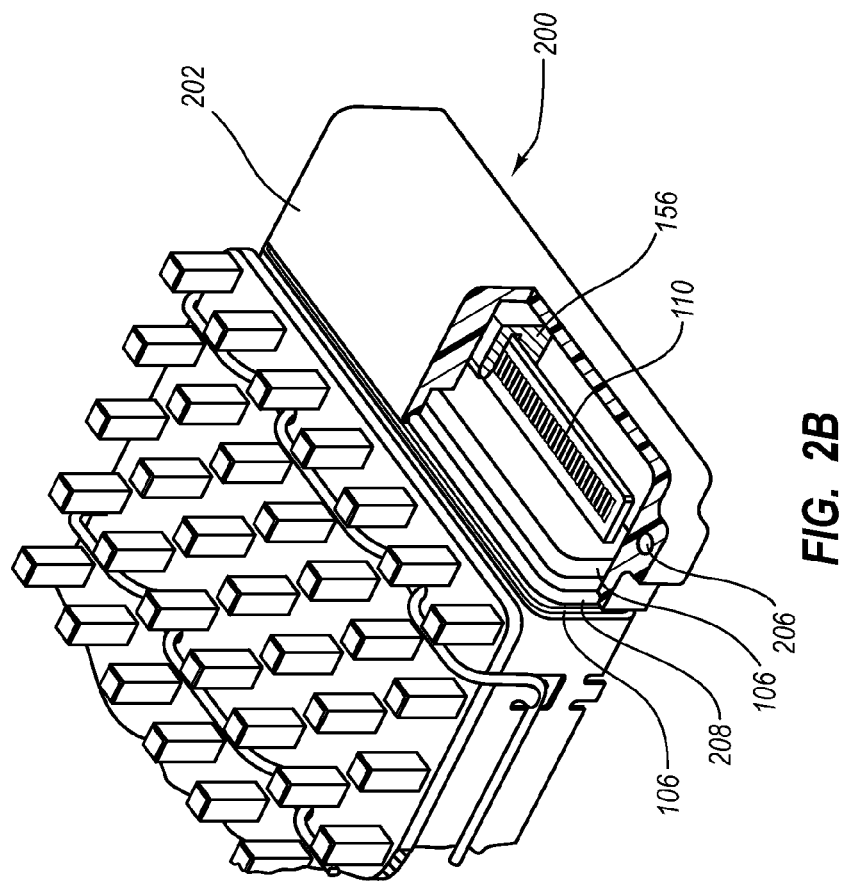
FIG. 2B is a partial rear top perspective view of the example electromagnetic radiation containment system of FIG. 1C.
Figure 2A:
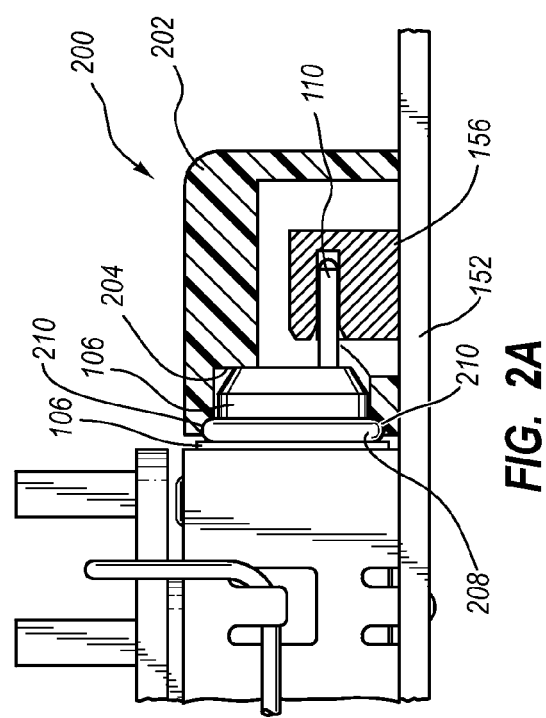
FIG. 2A is a partial side view of the example electromagnetic radiation containment system of FIG. 1C.

With continued reference to the example operating environment disclosed in FIG. 1C, attention is directed now as well to FIGS. 2A and 2B which disclose aspects of one example of an electromagnetic radiation containment system denoted generally at 200.

It should be noted that embodiments of the electromagnetic radiation containment system 200 are not constrained for use in connection with any particular device, protocol, data rate or other specific parameter or group of parameters. Thus, while some embodiments of the electromagnetic radiation containment system 200 are particularly well suited for implementation in connection with 100 Gb/s transponder modules and/or transceiver modules, the scope of the invention is not so limited. That is, the various principles underlying the example electromagnetic radiation containment system 200 may be extended without limitation to any of a variety of different devices and operating environments.

Turning now to FIGS. 2A and 2B, the example electromagnetic radiation containment system 200 includes various components, some of which may be implemented in connection with the host board 152 or other device into which a device such as the module 100 may be removably plugged, and some of which may be included as part of the module 100. It should be noted that while various components disclosed herein are referred to as comprising elements of the example electromagnetic radiation containment system 200, alternative embodiments of an electromagnetic radiation containment system consistent with this disclosure may include more, fewer and/or different components. Accordingly, the example electromagnetic radiation containment system 200 is not intended to limit the scope of the invention in any way.

Thus, in the example disclosed in FIGS. 2A and 2B, the electromagnetic radiation containment system 200 includes a ground plane (not shown) mounted to the host board 152. In some embodiments, the shape and extent of the ground plane generally corresponds to the 'footprint' of the module 100 so that the metal body of the module 100 is in substantial physical contact with the ground plane when the module 100 is received by the host board 152.

The electromagnetic radiation containment system 200 additionally includes a shroud 202 that is configured and arranged, on its bottom side, for substantial contact with the ground plane. Additionally, the shroud 202 substantially, or completely in some embodiments, encloses a host board connector 156 and defines an opening by way of which the edge connector 110, or other type of connector, of the module 100 may interface with the host board connector 156. In one example embodiment, the host board connector 156 and edge connector 110 comprise a 125 pin interface, although other sizes and configurations may be implemented. Example configurations of comparable interfaces are disclosed in the X2 and XFP MSAs, and manufactured by Tyco Electronics Corp.

As disclosed in FIGS. 2A and 2B, the shroud 202 substantially encloses the host board connector 156. In one example embodiment, the shroud 202 is a single piece of material formed by die-casting or other manufacturing process. Various types of metals may be employed in the construction of the shroud 202. In some applications, a shroud made of a nickel copper (Ni—Cu) plated zinc (Zn) alloy may be particularly effective, although other types of base metals and/or plating materials may be employed. The use of die-cast techniques in the manufacture of the example shroud 202 enables the shroud 202 to be produced relatively inexpensively.

As well, the use of the shroud 202 as a dedicated electromagnetic radiation containment component enables separation of the component from the cage and/or guide rail design of the module 100. Consequently, the overall complexity of the host board/module design is reduced. As well, the use of a dedicated electromagnetic radiation shielding component eliminates the need to shield the entire module 100 and, in that regard, represents a significant advance in the efficiency and ease with which electromagnetic radiation can be contained.

As best disclosed in FIG. 2A, another useful aspect of the shroud 202 is that it defines a mechanical hard stop 204 which the housing 106 of the module 100 abuts when the edge connector 110 is fully inserted into the shroud 202. Among other things, this mechanical hard stop 204 aids in the prevention of damage to the edge connector 110. As well, the structure and configuration of the shroud 202 aids in the guiding of the module 100 toward the host board connector 156.

The shroud 202 may be attached to the host board 152 in any suitable fashion, such as by soldering for example, that is effective in ensuring good contact between the shroud 202 and the ground plane (not shown) of the host board 152. In the example disclosed in FIGS. 2A and 2B, the shroud 202 defines one or more tapped holes 206 configured to receive a fastener (not shown) passing through the host board 152 and the ground plane.

With continuing reference to FIGS. 2A and 2B, the example electromagnetic radiation containment system 200 further includes an electrically conductive sealing element 208, such as an O-ring or a D-Ring for example, that is disposed about one end of the housing 106 of the module 100 near the edge connector 110 of the module 100 (also shown in FIG. 1B). In this example, the module 100 defines a groove or other feature which aids in the retention of the sealing element 208 in a desired position and orientation. In at least one alternative embodiment, the sealing element 208 is retained by the shroud 202 rather than by the housing 106.

The sealing element 208 may be made of any suitable material(s). In one example implementation, the sealing element 208 is a metal-impregnated elastomer. The metal particles aid in electromagnetic radiation containment, while the compliant nature of the elastomer ensures a good and reliable seal between the module 100 and the shroud 202, as discussed in further detail below. Some example electrically conductive sealing elements include, but are not limited to, Chomerics D-ring and O-ring conductive elastomer gaskets manufactured by Parker Hannifin Corporation headquartered in Woburn, Mass. Yet other examples of suitable electrically conductive sealing elements include the Vanguard EMI/RFI shielding configurations manufactured by Vanguard Products Corporation headquartered in Danbury, Conn. However, the sealing element 208 is not limited to these examples.

Of course, variables such as the size and configuration of the sealing element 208 will depend upon the particular application. In one example 100 G module, the sealing element 208 has a substantially circular cross-section of about 1 mm to about 2 mm.

With continued attention to FIG. 2A, the sealing element 208 interfaces with the shroud 202 to substantially, or completely, in some embodiments, seal the edge connector 110 of the module 100 within the shroud 202. In the example embodiment of FIGS. 2A and 2B, the shroud 202 defines a feature 210 which is configured and arranged to receive at least a portion of the sealing element 208. By way of example, the feature 210 may comprise a groove, or portion thereof, having a cross-section that is similar in shape and size to a portion of the cross-section of the sealing element 208.

By virtue of its compliant nature, the sealing element 208 is able to make up for any tolerance stacking or other inaccuracies or imprecision in the manufacture of the module 100 and/or the shroud 202. As well, the sealing element 208 is quite robust and easy to install and replace when the need arises. Finally, the conductive particles or material in the sealing element 208 contribute significantly to electromagnetic radiation containment.

With continued reference to FIGS. 2A and 2B, other useful aspects of the example electromagnetic radiation containment system 200 concern the connector configuration of the module 100. Particularly, the positioning, above the host board 152, of the portion of the module 100 about which the sealing element 208 is disposed means that the interface between the module 100 and the shroud 202 is independent of the host board 152 or any other structures.

Further, the shroud 202 and sealing element 208 complete the enclosure of the edge connector 110 of the module 100. In this way, the shroud 202 and the sealing element 208 cooperate to complete a Faraday cage, which may or may not be substantially airtight, around the edge connector 110 of the module 100. In this way, electromagnetic radiation that would otherwise escape from the edge connector 110 and/or from the host board connector 156 and create EMI is substantially contained within the enclosure at least partially defined by the shroud 202 and sealing element 208. Such containment of electromagnetic radiation is particularly desirable in high speed/high frequency applications such as 100 Gb/s/100 GHz modules, although the containment functionality afforded by the example electromagnetic radiation containment system 200 extends as well to lower, and higher, speeds and/or frequencies.

III. Example Heat Management System

Figure 3B:
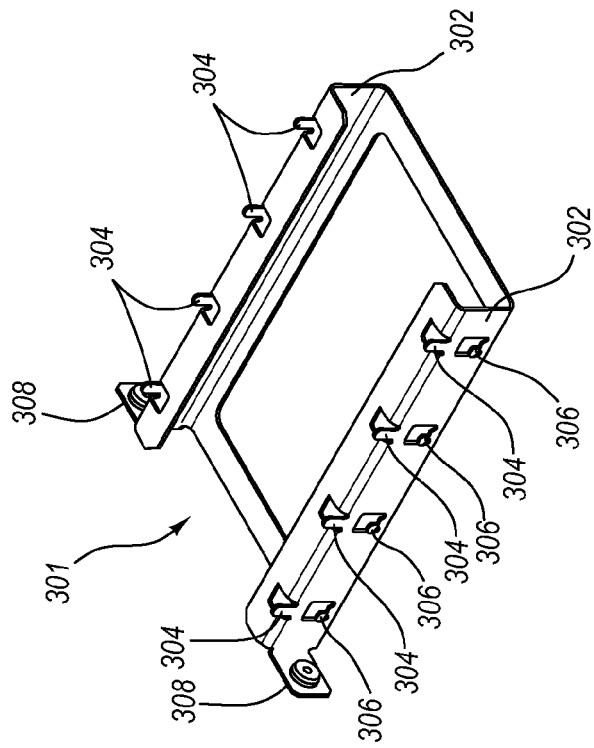
FIG. 3B is a rear bottom perspective view of the example heat management system of FIG. 1C.
Figure 3A:
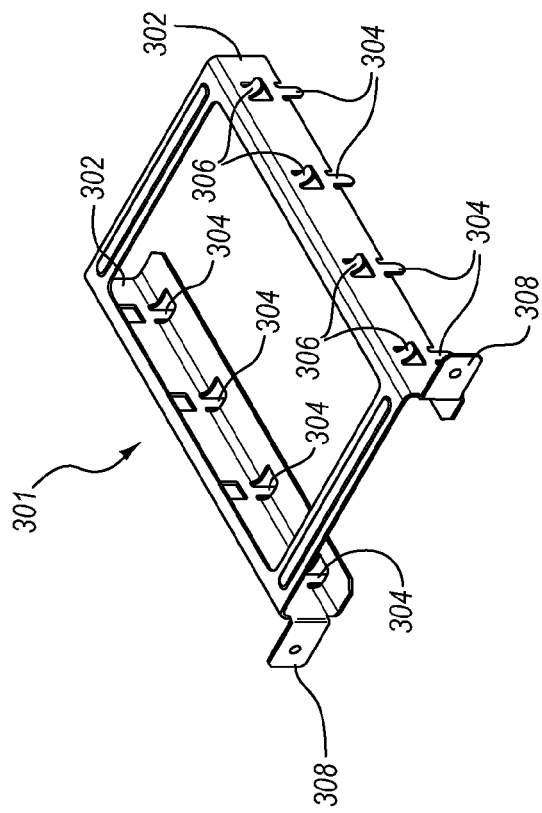
FIG. 3A is a front top perspective view of a portion of the example heat management system of FIG. 1C.
Figure 4:
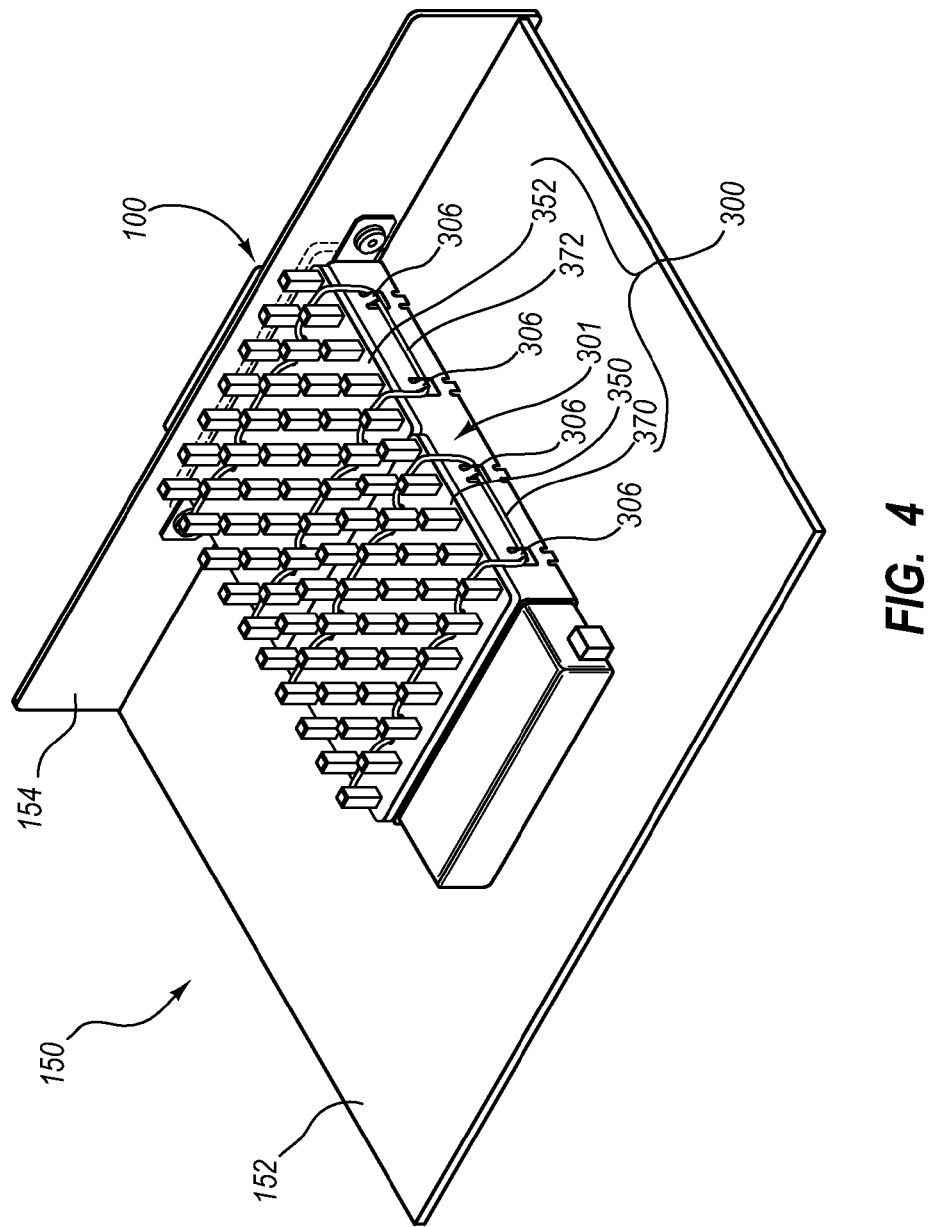
FIG. 4 is a rear top perspective view of the example heat management system of FIG. 1C.

Turning now to FIGS. 3A, 3B, and 4, additional aspects of the example heat management system 300 are disclosed. The example heat management system 300 generally includes an example module guide 301, example heat sink elements 350 and 352, and example retention elements 370 and 372. In at least some embodiments, as disclosed in FIG. 4, one or more of the heat sink elements 350 and 352 comprise a configuration having a substantially planar surface on one side of the heat sink element, and a plurality of extended surfaces on another side of the heat sink element, though the scope of the invention is not limited to such configurations.

With reference first to FIGS. 3A and 3B, the module guide 301 is configured to be mounted to a host board of a host device, such as the host board 152 of the host device 150 disclosed in FIG. 1C. The module guide 301 includes rails 302 which are configured and arranged such that the example module 100, or other module(s), can be reliably guided by the rails 302 into a proper position with respect to the host board to which the module guide 301 is attached. The module guide 301 also includes fingers 304 along the rails 302 which can be used to attach the module guide 301, such as by soldering for example, to a host board of a host device. The module guide 300 further includes hooks 306 along the rails 302 which can be used to engage, releasably in some cases, one or more retention elements for securing two or more heat sink elements, as discussed below in connection with FIG. 4. Finally, the module guide 301 includes one or more structures, such as flanges 308 for example, which can be used to attach the module guide 300 to a face plate of a host device, such as the face plate 154 of the host device 150.

With reference now to FIG. 4, two heat sink elements 350 and 352 are disclosed, positioned on the module guide 301 above the module 100. The heat sink elements 350 and 352 are held in position by retention elements 370 and 372, respectively. In this example embodiment, the retention elements 370 and 372 comprise clips configured to releasably engage respective hooks 306 located along the rails 302 (see FIGS. 3A and 3B), though the scope of the invention is not limited to the use of clips as retention elements. By virtue of their connection to the hooks 306, as well as their resilient nature, the retention elements 370 and 372 serve to bias the heat sink elements 350 and 352 such that heat sink elements 350 and 352 press down against, and make substantial contact with, the top of the module 100. In this way, the heat sink elements 350 and 352 contribute to the transfer of heat generated during the operation of the module 100.

As suggested by the Figures, each of the heat sink elements 350 and 352 is able to move independently of the other so as to press down against a respective portion of the top surface of the module 100. This capability of the heat sink elements 350 and 352 allows for looser tolerances for the planarity of the bottom surfaces of the heat sink elements 350 and 352 and the top surface of the housing 106 of the module 100 than where a single heat sink element is used to cover the entire top surface of the housing 106. That is, the use of multiple heat sink elements results in a heat sink element arrangement that is better configured to compensate for irregularities in the surface of the housing of a module and thereby contributes to an improved level of contact, and thus heat transfer, between the module surface and the group of heat sink elements.

Although FIG. 4 discloses only two heat sink elements covering the module 100, more than two heat sink elements could be used, resulting in even looser tolerances for the planarity of bottom surfaces of each of the heat sink elements and the top surface of the housing of the module 100. More generally, parameters such as the size, number, orientation and configuration of the heat sink elements may be varied as required to suit the constraints of a particular application. Accordingly, the scope of the invention is not limited to the example disclosed embodiments.

IV. Another Example Heat Management System

Figure 5:
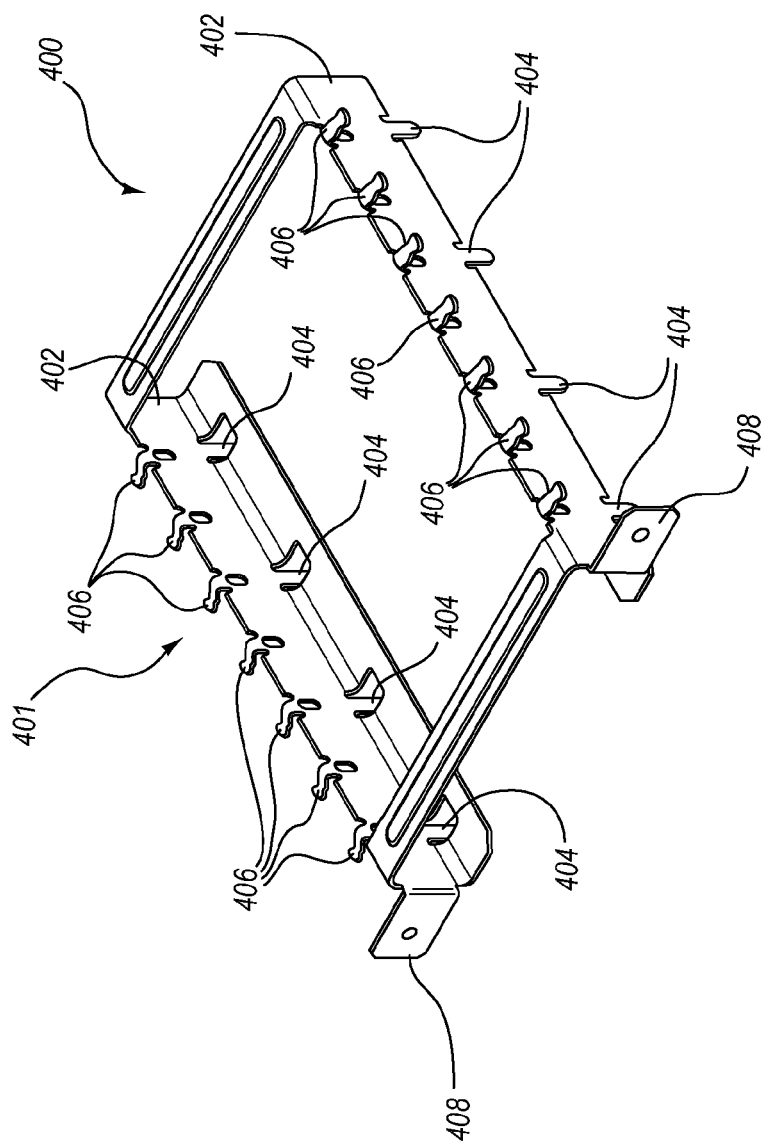
FIG. 5 is a front top perspective view of a portion of another example heat management system.

Turning now to FIGS. 5, 6A, 6B, and 6C, another example heat management system 400 is disclosed. With reference first to FIG. 5, an example module guide 401 is disclosed. The module guide 401 includes rails 402, fingers 404, and flanges 408 that may be identical to, respectively, rails 302, fingers 304, and flanges 308 of the example module guide 300 discussed above in connection with FIGS. 3A and 3B. In addition, the example module guide 400 further includes retention elements 406, which may or may not be integrally formed with the rails 402, configured and arranged to engage corresponding heat sink elements, as discussed below in connection with FIGS. 6A-6C. In the illustrated example, the retention elements 406 each comprises a structure that extends from the rail 402 and terminates in a free end though, as noted earlier, the scope of the invention is not limited to any particular embodiment of a retention element.

With reference now to FIGS. 6A-6C, disclosed are seven heat sink elements 452-464 positioned on the module guide 401 above the module 100. As disclosed in FIG. 6B, the heat sink element 452 is held in position atop the module 100 by the retention elements 406 located along the rails 402 of the module guide 400. The respective free ends of the retention elements 406 bias against protrusions 453 of the heat sink element 452 such that heat sink element 452 is pressed down against the top of the module 100. The heat sink elements 452-464 function similarly to the heat sink elements 370 and 372 to enable the transfer of heat generated during the operation of the module 100. Similarly, each of the heat sink elements 452-464 presses down, independently of the other heat sink elements, against a respective portion of the top surface of the module 100.

This independent movement of the heat sink elements 452-464 allows for looser tolerances for the planarity of the bottom surfaces of the heat sink elements 452-464 and the top surface of the housing 106 of the module 100 than would be possible if a single heat sink element were used to attempt to contact the entire top surface of the housing 106 of the module 100. The improved degree of contact afforded by the use of the multiple heat sink elements thus results in a heat sink arrangement that exhibits improved heat transfer characteristics and, thus, device performance.

The example embodiments disclosed herein may be embodied in other specific forms. These example embodiments are to be considered in all respects only as illustrative and not restrictive.

What is claimed is:

1. An electromagnetic radiation containment system, comprising:
   an electronic module having a protruding edge connector;
   a host board having a host board connector mounted thereto;
   an electrically conductive shroud mounted to a ground plane of the host board, the electrically conductive shroud defining a first opening by way of which the edge connector of the electronic module can be received and that is sealed by the host board, the electrically conductive shroud further defining a second opening through which the host board connector is received, the electrically conductive shroud being devoid of other openings that are large enough for electromagnetic radiation to escape therethrough, the electrically conductive shroud sized and shaped to substantially enclose the host board connector mounted to the host board; and
   an electrically conductive sealing element disposed about a portion of the electronic module such that, when the edge connector of the electronic module is fully received in the host board connector, the electrically conductive sealing element cooperates with the electronic module to seal the second opening of the electrically conductive shroud, the sealed electrically conductive shroud defining a Faraday cage substantially enclosing the edge connector and the host board connector.

2. The electromagnetic radiation containment system as recited in claim 1, wherein the electrically conductive shroud is a single piece of material.

3. The electromagnetic radiation containment system as recited in claim 1, wherein the electrically conductive shroud is die-cast from one or more metals.

4. The electromagnetic radiation containment system as recited in claim 1, wherein the electrically conductive shroud comprises a nickel copper (Ni—Cu) plated zinc (Zn) alloy.

5. The electromagnetic radiation containment system as recited in claim 1, wherein the electrically conductive shroud defines a hard stop which is abutted by a housing of the electronic module when the edge connector is fully received in the electrically conductive shroud.

6. The electromagnetic radiation containment system as recited in claim 1, wherein the Faraday cage is substantially airtight.

7. The electromagnetic radiation containment system as recited in claim 1, wherein the electrically conductive shroud is substantially rectangularly shaped with four solid sides, two open sides, and a hollow core.

8. The electromagnetic radiation containment system as recited in claim 7, wherein each of the four solid sides is devoid of openings.

9. An electronic module, comprising:
a housing;
a printed circuit board partially positioned within the housing and defining an edge connector extending from the housing; and
an electrically conductive sealing element radially surrounding 360 degrees of one end of the housing and the printed circuit board proximate the edge connector such that when the edge connector is fully received in a host board connector mounted to a host board, the electrically conductive sealing element cooperates with a corresponding structure of the host board to at least partially define a Faraday cage substantially enclosing the edge connector and the host board connector, wherein the housing defines a radial groove which aids in the retention of the sealing element.

10. The electronic module as recited in claim 9, wherein the printed circuit board includes circuitry configured to operate at a data rate of at least about 100 Gb/s.

11. The electronic module as recited in claim 9, wherein the electronic module substantially conforms to the X2 MSA.

12. The electronic module as recited in claim 9, wherein the electrically conductive sealing element comprises a metal-impregnated elastomer D-ring or O-ring.

13. A host board, comprising:
a printed circuit board;
a ground plane attached to the printed circuit board;
a host board connector attached to the ground plane; and
an electrically conductive shroud mounted to the ground plane and substantially enclosing the host board connector, the electrically conductive shroud defining an opening by way of which an edge connector of an electronic module can be received, the electrically conductive shroud being devoid of other unsealed openings that are large enough for electromagnetic radiation to escape therethrough, the electrically conductive shroud sized and shaped to cooperate with a corresponding structure of the electronic module to form a Faraday cage substantially enclosing the edge connector and the host board connector.

14. The host board as recited in claim 13, wherein the electrically conductive shroud is a single piece.

15. The host board as recited in claim 13, wherein the electrically conductive shroud is die-cast from one or more metals.

16. The host board as recited in claim 13, wherein the electrically conductive shroud comprises a nickel copper (Ni—Cu) plated zinc (Zn) alloy.

17. The host board as recited in claim 13, wherein the printed circuit board includes circuitry configured to operate at a data rate of at least about 100 Gb/s.

18. The host board as recited in claim 13, wherein the electrically conductive shroud further defines a groove having a cross-section that is similar in shape and size to a portion of the cross-section of the corresponding structure of the electronic module.

19. The host board as recited in claim 18, wherein the electrically conductive shroud further defines a hard stop which is abutted by a housing of the electronic module when the edge connector is fully received in the electrically conductive shroud.

* * * * *